(12) United States Patent
Lu et al.

(10) Patent No.: US 10,084,433 B2
(45) Date of Patent: *Sep. 25, 2018

(54) FEEDFORWARD FILTER USING TRANSLATIONAL FILTER

(71) Applicant: MEDIATEK INC., Hsin-Chu (TW)

(72) Inventors: Ying-Tsang Lu, Hsinchu County (TW); Chih-Ming Hung, Mckinney, TX (US); Meng-Chang Lee, Hsinchu County (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/125,145

(22) PCT Filed: Mar. 13, 2015

(86) PCT No.: PCT/CN2015/074232
§ 371 (c)(1),
(2) Date: Sep. 10, 2016

(87) PCT Pub. No.: WO2015/135508
PCT Pub. Date: Sep. 17, 2015

(65) Prior Publication Data
US 2016/0380618 A1 Dec. 29, 2016

Related U.S. Application Data

(60) Provisional application No. 61/952,571, filed on Mar. 13, 2014.

(51) Int. Cl.
*H03K 5/00* (2006.01)
*H03H 19/00* (2006.01)
(Continued)

(52) U.S. Cl.
CPC .......... *H03H 19/002* (2013.01); *H03D 7/165* (2013.01); *H04L 25/0278* (2013.01)

(58) Field of Classification Search
CPC ............... H03H 11/0422; H03H 11/04; H03H 11/1291; H03H 11/1213; H03K 5/1252
(Continued)

(56) References Cited

U.S. PATENT DOCUMENTS 8,145,155 B2 * 3/2012 Pullela ................. H03D 7/1441
375/316
8,483,826 B2 * 7/2013 Zielinski ............... A61N 1/3627
607/15
(Continued)

FOREIGN PATENT DOCUMENTS

| CN | 86105367 A | 2/1987 |
|---|---|---|
| CN | 1494287 A | 5/2004 |

(Continued)

OTHER PUBLICATIONS

"International Search Report" dated Jun. 3, 2015 for International application No. PCT/CN2015/074232, International filing date:Mar. 13, 2015.

*Primary Examiner* — Dinh T Le
(74) *Attorney, Agent, or Firm* — Wolf, Greenfield & Sacks, P.C.

(57) ABSTRACT

In accordance with an embodiment, a feedforward filter includes a first path, at least one second path and a signal combiner. The first path has a first translational filter, and employed for providing a first frequency response and generating a first output in response to an input signal based on the first frequency response. The at least one second path has a second translational filter and is coupled to the first path. The at least one second path is employed for providing a second frequency response that is different from the first frequency response to the input signal, and generating at (Continued)

least one second output in response to the input signal based on the second frequency response. The signal combiner is coupled to the first path and the second path, and employed for combining the first output and the at least one second output to generate a filtered signal.

51 Claims, 16 Drawing Sheets

(51) Int. Cl.
*H04L 25/02* (2006.01)
*H03D 7/16* (2006.01)

(58) Field of Classification Search
USPC .................................. 327/551–559, 355–360
See application file for complete search history.

(56) References Cited

U.S. PATENT DOCUMENTS

| | | | |
|---|---|---|---|
| 8,570,100 B2* | 10/2013 | Morishita | H04B 1/0007 327/355 |
| 9,136,815 B2* | 9/2015 | Aggarwal | H03H 19/002 |
| 2001/0007479 A1 | 7/2001 | Kim | |
| 2005/0041732 A1 | 2/2005 | Kim | |
| 2011/0176640 A1* | 7/2011 | Morishita | H03H 15/00 375/318 |
| 2013/0335163 A1 | 12/2013 | Aggarwal et al. | |

FOREIGN PATENT DOCUMENTS

| | | |
|---|---|---|
| CN | 1599363 A | 3/2005 |
| CN | 101500105 A | 8/2009 |
| JP | 2009272864 A | 11/2009 |
| WO | WO 2011/024481 A1 | 3/2011 |

* cited by examiner (Non-overlapped)

(Overlapped)

FEEDFORWARD FILTER USING TRANSLATIONAL FILTER

CROSS REFERENCE TO RELATED APPLICATIONS

This Application is a national stage filing under 35 U.S.C. § 371 of International Patent Application Ser. No. PCT/CN2015/074232, filed Mar. 13, 2015, entitled "FEEDFORWARD FILTER USING TRANSLATIONAL FILTER", which claims the benefit under 35 U.S.C. § 119(e) of U.S. Provisional Patent Application, Ser. No. 61/952,571, filed on Mar. 13, 2014, the entire contents of which are hereby incorporated by reference.

TECHNICAL FIELD

The present invention relates to a filter, and more particularly, to a feedforward filter having multiple paths connected in parallel, each based on a translational filter.

BACKGROUND

Filters have the ability to pass desired signals over a range of frequencies to the following stages, while reject other unwanted signals or interference. Some characteristics of the filters are highly demanded, for example, high-Q, high linearity, high out-of-band rejection, and low in-band loss. However, these characteristics can hardly be realized in a low-cost, low power consumption and small-sized filter by means of the conventional architecture. Therefore, there is a need to provide a novel architecture to realize a filter having good performance based on low-cost, low power consumption and small-sized designs.

SUMMARY

With the aforementioned in mind, one objective of the present invention is to provide a feedforward filter based on translational filters disposed on multiple paths in the feedforward filter. In combination with cancellation or combination techniques, the feedforward filter can have a frequency response with multiple pass-bands/stop-bands and high out-of-band rejection. As the translational filter inherently has high-Q and tunable yet precise center frequency, a filter having excellent performance can be achieved.

According to one embodiment of the present invention, a feedforward filter is provided. The feedforward filter comprises: a first path, at least one second path, and a signal combiner. The first path has a first translational filter, and is employed for providing a first frequency response and generating a first output in response to an input signal based on the first frequency response. The at least one second path has a second translational filter and is coupled to the first path. The at least one second path is employed for providing a second frequency response that is different from the first frequency response, and generating at least one second output in response to the input signal based on the second frequency response. The signal combiner is coupled to the first path and the second path, and employed for combining the first output and the at least one second output to generate a filtered signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Figure 1:
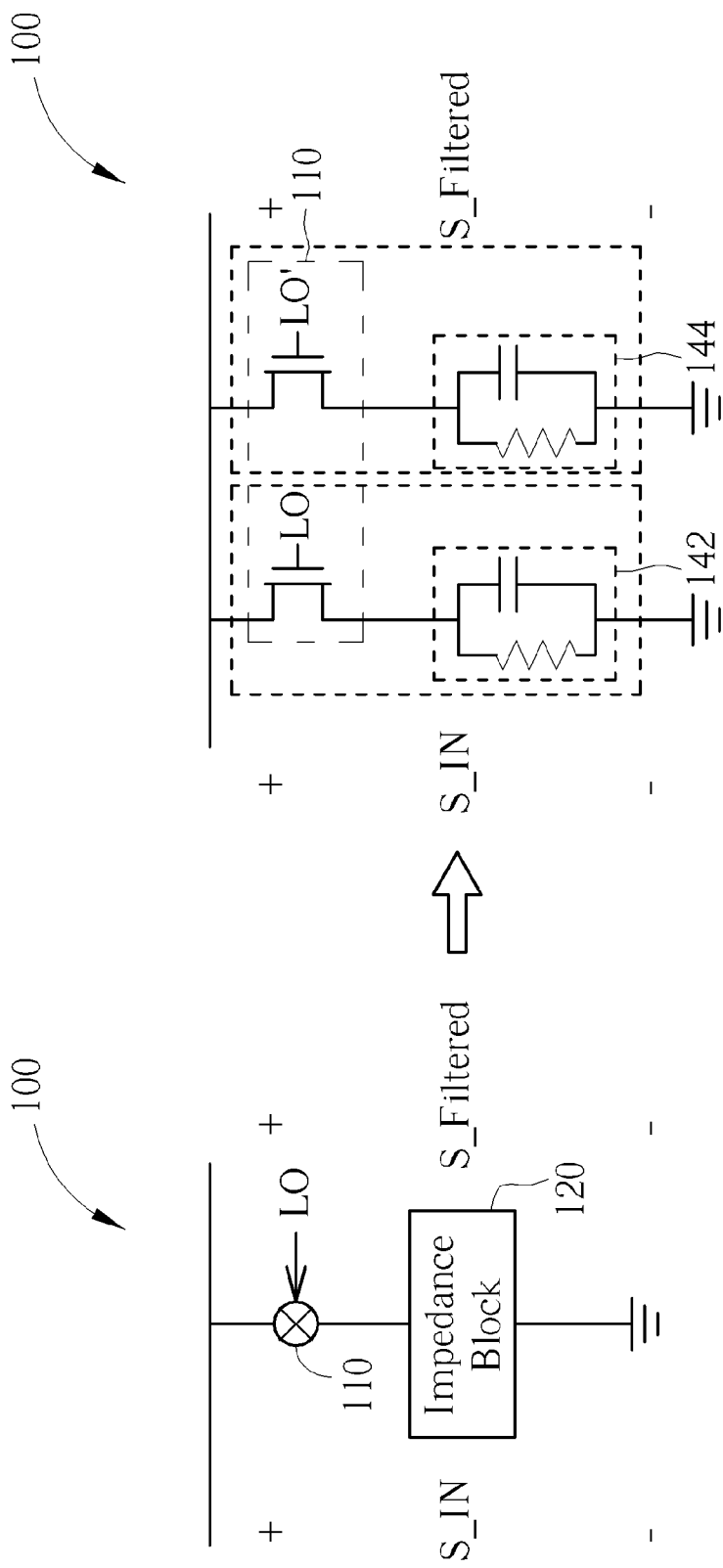
FIG. 1 illustrates a translational filter according to one embodiment of the present invention.

Translational Filter:

Please refer to FIG. 1, which illustrates a block diagram of a translational filter. As illustrated by the figure, a translational filter 100 includes a switching mixer 110 and an impedance block 120. The switching mixer 110 mixes an input signal S_IN with a local oscillation signal LO. The impedance block 120 provides specific impedance in response to all mixing products after mixing switches. This baseband impedance will be translated to input and leads to a symmetric filter response near the LO frequency $f_{LO}$. A filtered signal S_Filtered is therefore generated at the terminal that the input signal S_IN is sent to. As shown on the right hand side of FIG. 1, the switching mixer 110 includes MOS switches that are driven by multiple phases of local oscillation signal LO. More specifically, the switching mixer 110 in this illustration includes MOS switches that are respectively driven by local oscillation signals LO and LO' with different phases.

Figure 2:
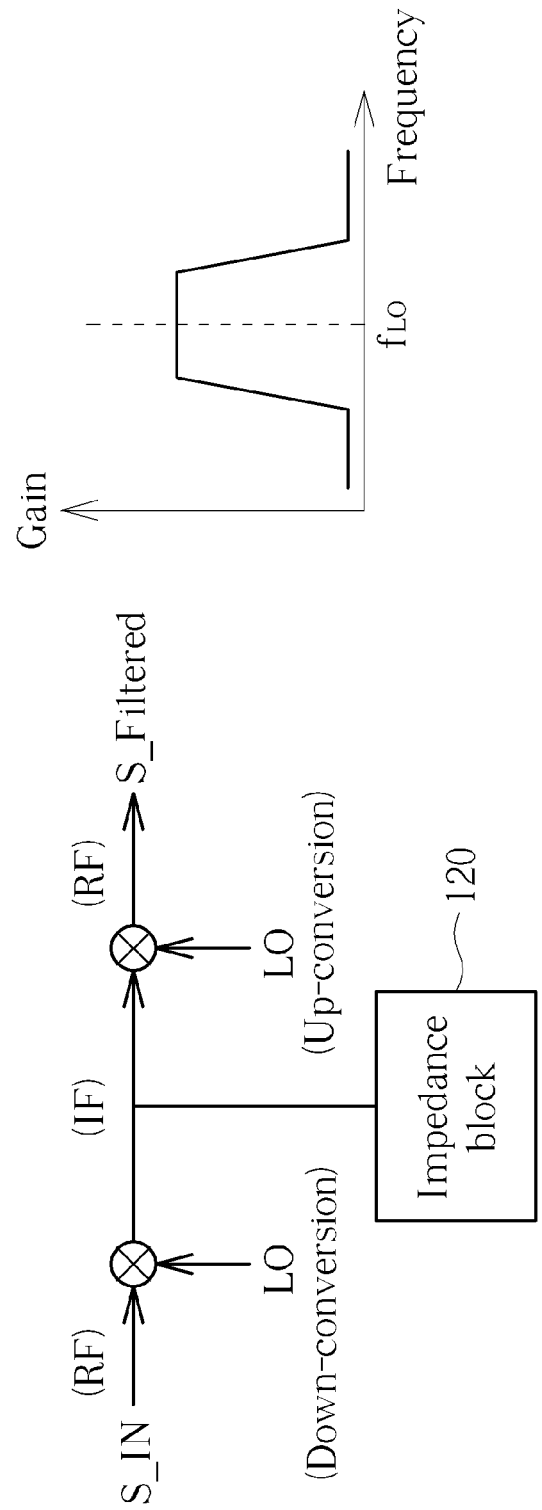
FIG. 2 illustrates an equivalent model of the translational filter as shown in FIG. 1.

An equivalent model of the translational filter 100 is illustrated in FIG. 2. The operations of translational filter 100 can be considered as firstly performing a down-conversion operation on the input signal S_IN to translate the input signal S_IN to an intermediate frequency accompanied a frequency response in accordance to baseband impedance block. Then, perform an up-conversion operation on a result of down-conversion to generate the filtered signal S_Filtered. With the aid of the impedance provided by the impedance block 120, the translational filter 100 can provide a frequency response over a specific range of frequencies. Assuming that the impedance block 120 (or impedance block 142(144)) is comprised of a capacitor in parallel with a resistor, the translational filter 100 is substantially a band-pass filter, and has a frequency response as illustrated on the right hand side of FIG. 2.

Please note that according to various embodiments of the present invention, the switching mixer 110 could be replaced with any other types of mixers, while the impedance block 120 (i e, impedance block 142(144)) could include any possible combination of active and/or passive components, such as amplifiers, transconductors, inductors, capacitors, resistors (e.g. C, RC, LC, or RLC). Depending on the components in the impedance block 120, the translational filter 100 could be a band-stop filter, a band-pass filter, an all-pass filter or a combination of different filtering shapes in both real and complex domains. For example, when the impedance block 120 includes an inductor in parallel with a capacitor, the impedance block 120 could have a band-pass frequency response and leads to a double pass-band frequency response on translational filter. In addition, using an active component, such as an amplifier or transconductor, to combine with capacitors and resistors can also realize an active inductive component to achieve the same effect.

Figure 3A:
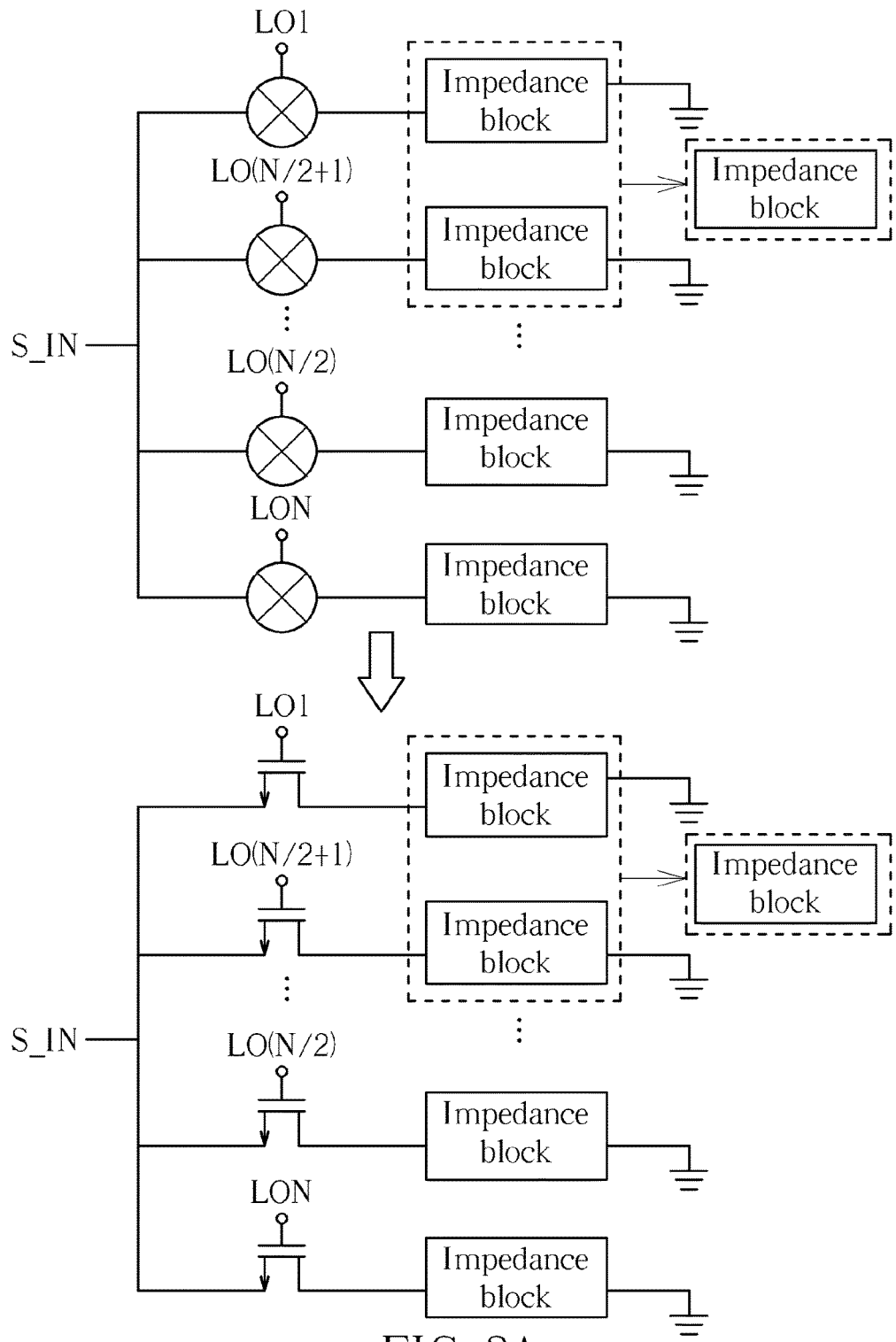
FIGS. 3A and 3B illustrate an extended architecture of the translational filter according to one embodiment of the present invention.

The translational filter 100 can be extended to a generalized single ended N-Path filter as shown by FIG. 3A, which contains N identical branches each of which includes a switching mixer that is driven by one of N-phase LO signals and one or more impedance block. A switching mixer could be coupled to the ground through an impedance block. Alternatively, two switching mixers that are driven by complementary-phases LO signals could share one impedance block without being coupled to the ground. In addition, the switching mixer could be implemented simply with a NMOS switch or other types of transistors.

Figure 3B:
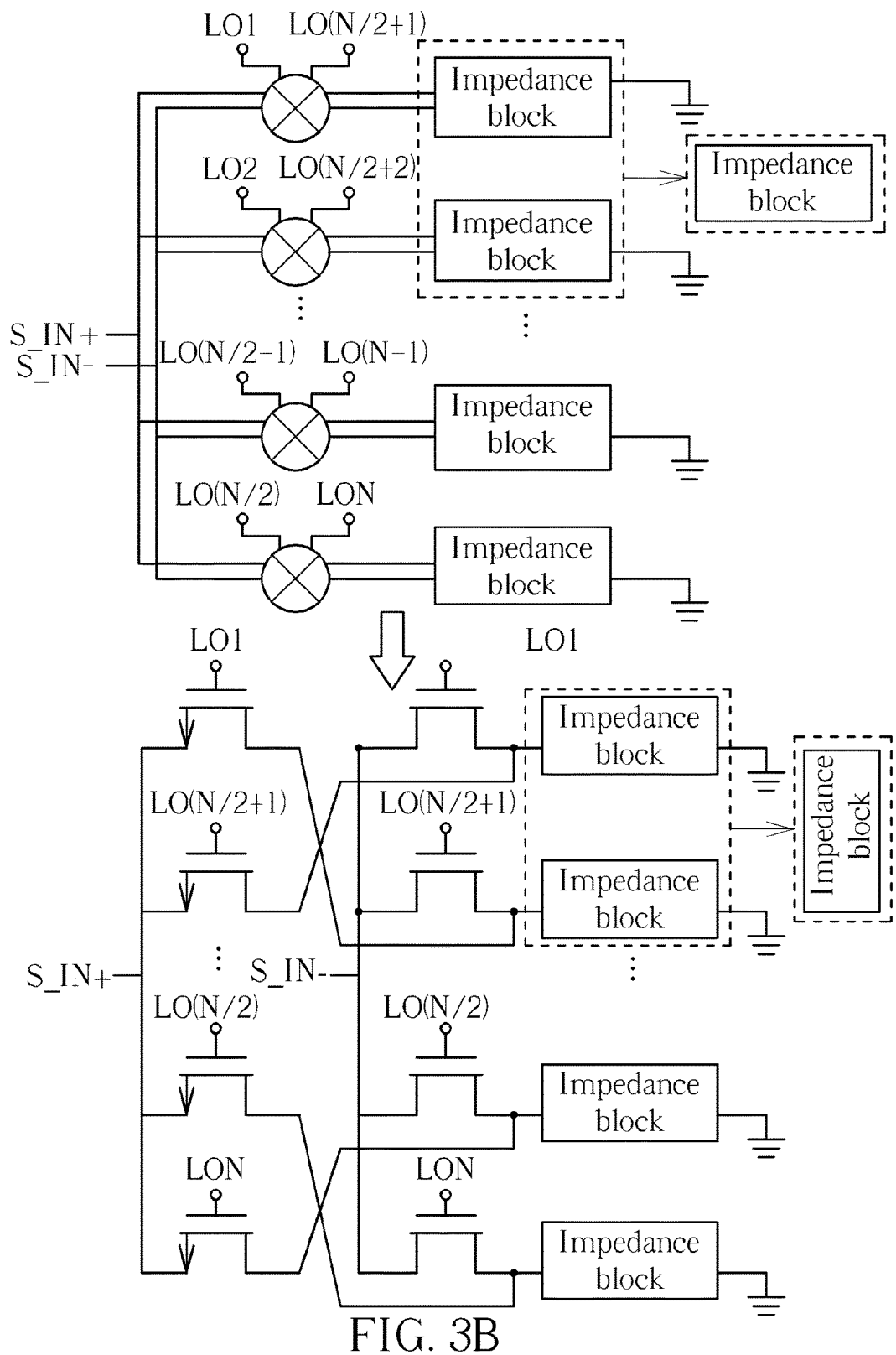

The N-path filter can be in the form of differential configuration. FIG. 3B illustrates a differential form of an N-path filter according to one embodiment of the present invention. The differential N-path filter includes two parts. One part is for positive component S_IN+ of the input signal S_IN, while the other part is for negative component S_IN− of the input signal S_IN. One of the filter branches of the part for positive component share an impedance block with one of the filter branches of the part for negative component, and they are interconnected. Similarly, a switching mixer could be coupled to the ground through an impedance block. Alternatively, two switching mixers that are driven by complementary-phases LO signals could share one impedance block without being coupled to the ground. In addition, the switching mixer could be also implemented simply with a NMOS switch or other types of transistors.

Figure 4:
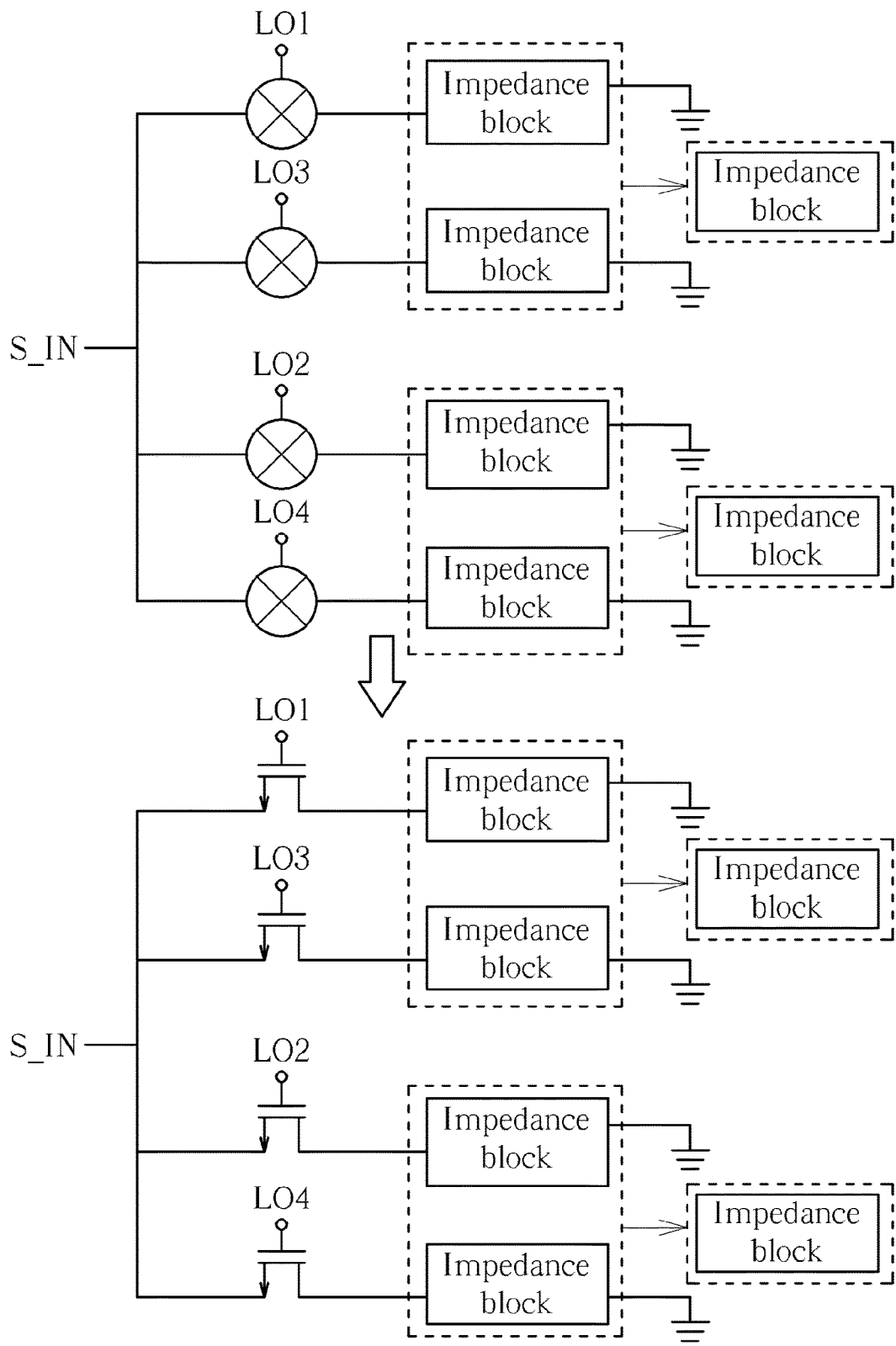
FIG. 4 illustrates filter branches in the translational filter according to one embodiment of the present invention.

For most of applications, a translational filter 200 is implemented by at least four filter branches 210-240 as illustrated in FIG. 4 for either single-ended or differential translation filter configurations. For single-ended cases, the number of branches may be reduced by half. The four branches 210, 220, 230 and 240 are driven by four-phase local oscillation signals such as 0, 90, 180, and 270 degree for LO1, LO2, LO3, and LO4, respectively to prevent degradation of the desired signal resulting from signal and noise at the image location on the frequency spectrum. A switching mixer could be coupled to the ground through an impedance block. Alternatively, two switching mixers that are driven by complementary-phase LO signals (e.g. switching mixer driven by LO1 and LO3, LO2 and LO4) could share one impedance block without being coupled to the ground.

The translational filter 200 provides a frequency response based on each of the impedance blocks to filter the input signal S_IN. For the branches having differential relations, such as branches 210 and 230, the reference ground of the impedance blocks can be merged to form one differential impedance block. For example, two single-ended capacitors, one in 210 and the other in 230, can be combined as one differential capacitor at quarter size.

Figure 5:
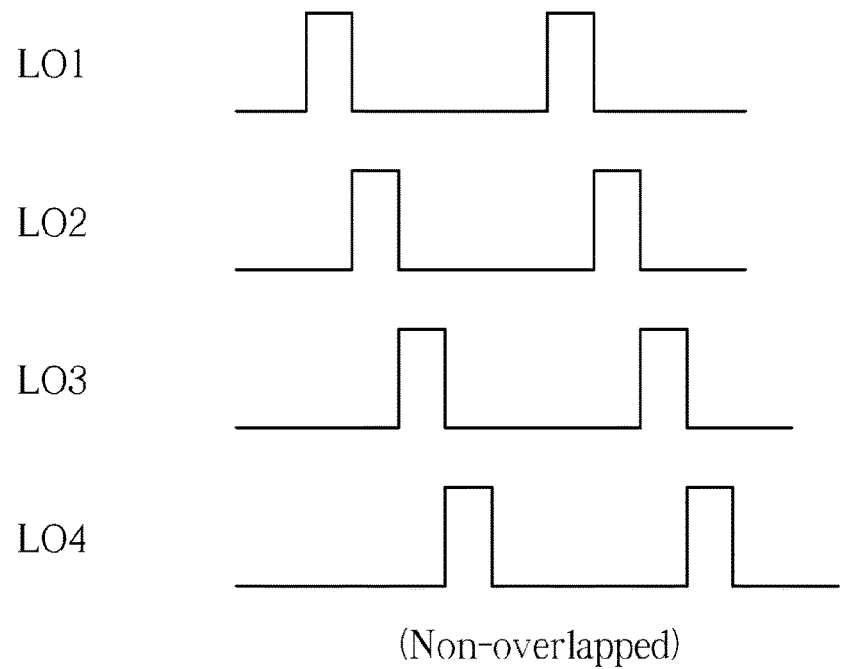
FIG. 5 illustrates timing charts of the local oscillation signals that is used to drive MOS switches of filter branches.
Figure 5:
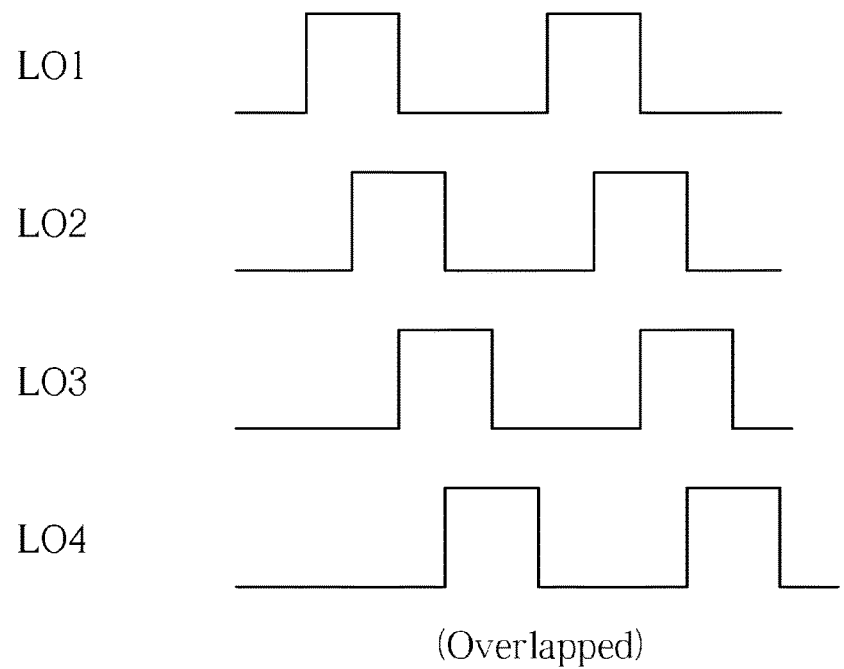

The N-Phase local oscillation signals could be either non-overlapped or overlapped. Typically, duty-cycle of N-Phase LO is designed to be $(100/N)\%$, however, some specific duty-cycle might be taken for special design requirements, such as harmonic rejection. According to different embodiments of the present invention, timing charts of the oscillation signals LO1-LO4 are illustrated in FIG. 5. That is, the oscillation signals LO1-LO4 could be either 25% duty-cycle or 50% duty-cycle, and could be overlapped or non-overlapped.

The translational filter has advantages of High-Q, and precisely tunable center frequency. However, the out-of-band rejection is usually limited by on-resistance of the MOS switches. Therefore, the present invention utilizes a feedforward path to improve the performance of the translational filter in a main path.

Feedforward Cancellation/Combination Filter:

Based on the translational filter mentioned above, the present invention provides a feedforward filter. The feedforward filter comprises a first path (i.e., a main path) and at least one second path (i.e., a feedforward path), an input signal is sent to these paths, and outputs from these paths are combined using signal addition or signal subtraction circuits.

In the first path or the second path, at least one translational filter is included. There are two filter branches or four filter branches or other numbers of filter branch (depending on input signal and local oscillation signal contents) included in each translational filter. Components of impedance blocks in different paths could be identical or different. As illustrated in FIG. 4, each path will have a filtered result at the terminal that the input signal is sent to. The filtered result of each path is based on a frequency response provided by that path. Due to the signal combination, frequency responses of different paths will be combined to form an equivalent frequency response, and the input signal is substantially filtered based on the equivalent frequency response to generate the filtered signal.

Embodiment A:

In the embodiment A, a feedforward filter with high out-of-band rejection is provided. This feedforward filter includes one main path and one feedforward path. The in-band signal generated by the main path will be preserved while out-of-band signals or interference is cancelled out by those generated by the feedforward path. As a result, a band-pass filter with high out-of-band rejection is realized.

Figure 6A:
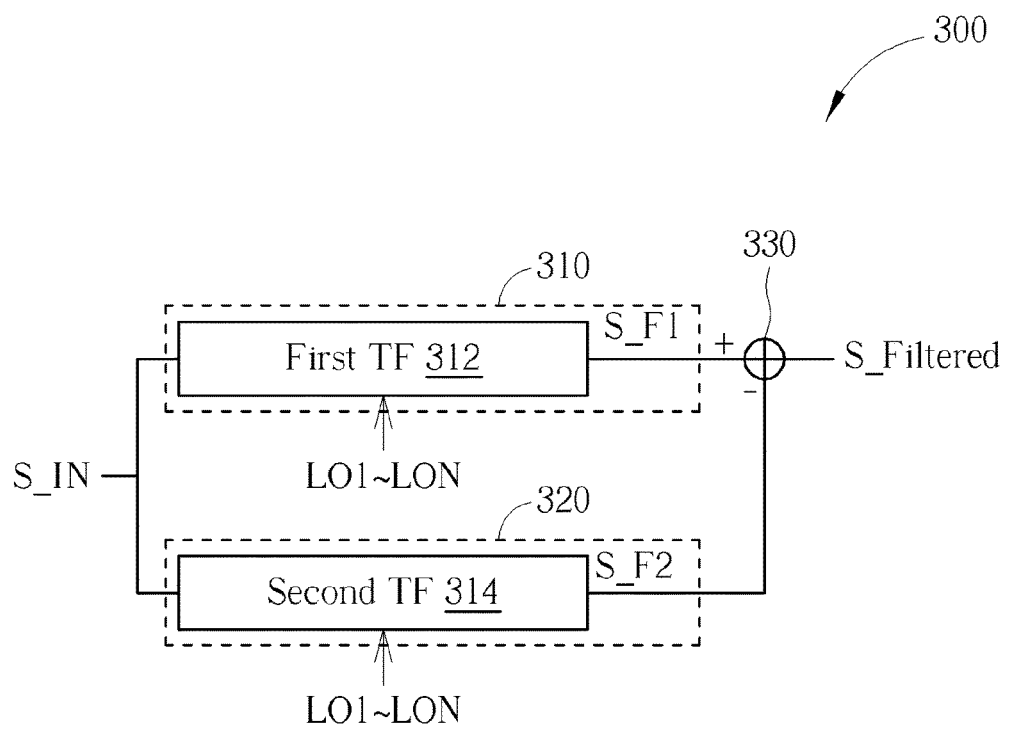
FIGS. 6A and 6B illustrate a block diagram and detailed implementation of a feedforward filter according to an embodiment A of the present invention.
Figure 6B:
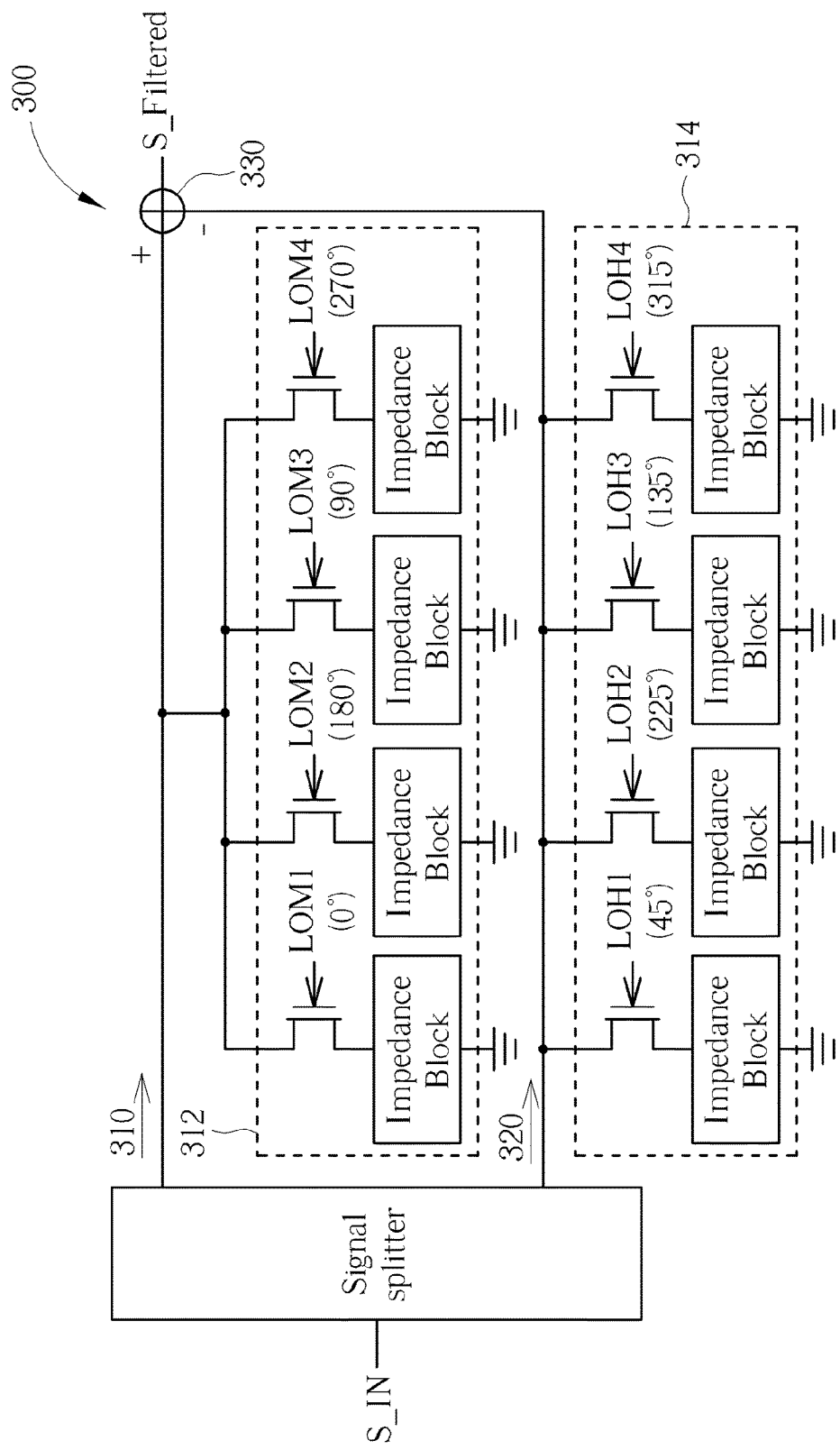

Referring to FIG. 6A and FIG. 6B, a block diagram and detailed implementation of a feedforward filter 300 according to the embodiment A of the present invention are illustrated. The feedforward filter 300 comprises a first path 310 and a second path 320. An input signal S_IN is sent to the first path 310 and the second path 320. The first path 310 and the second path 320 respectively generate a first output S_F1 and a second output S_F2. A signal subtractor 330 combines the first output S_F1 with the second output S_F2, thereby generating a filtered signal S_Filtered.

The first path 310 comprises a first translational filter 312. As mentioned earlier, depending on the content of the signal S_IN, the first translational filter 312 could include different number of filter branches, such as, 2 or 4. The latter (four filter branches in each translation filter) is shown in FIG. 6B as an example instead of a requirement. The signal S_IN is transmitted to the main path 310 and the feedforward path 320 through a signal splitter 301. The filter branches in the first translational filter 312 are driven by the corresponding local oscillation signals LO1-LON. In the case where the first translational filter 312 includes two filter branches, filter branches are respectively driven by local oscillation signals LO1-LO2 (at 0 and 180 degree, or 0 and 90 degree). In the case where the first translational filter 312 includes four filter branches, filter branches are respectively driven by local oscillation signals LO1-LO4 (at 0, 90, 180 and 270 degree).

The second path 320 comprises a second translational filter 314. The number of the filter branches included in the second translational filter 314 is identical to that in the first translational filter 312, and both of them depend on the content of the signal S_IN. Also, the local oscillation signals LO1-LON driving the filter branches in the second translational filter 314 are identical to those driving the filter branches in the first translational filter 312.

Figure 7:
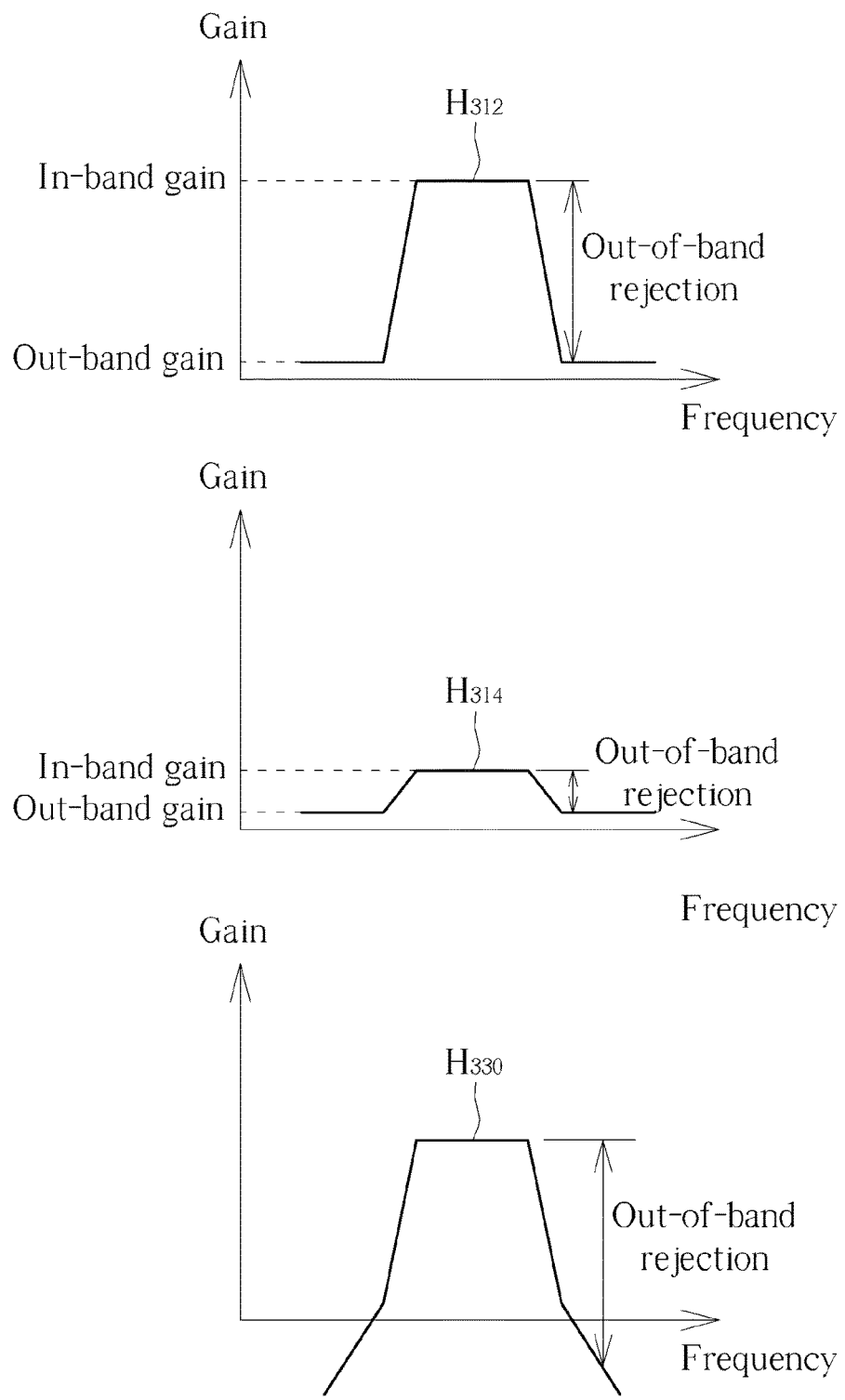
FIG. 7 illustrates frequency responses of first and second translational filter s and an equivalent frequency response with respect to a combination of two paths of the feedforward filter shown in FIG. 6.

In this embodiment, components included in the impedance block of each filter branch of the first translational filter 312 are a capacitor and a resistor connected in parallel, leading to a band-pass frequency response of the first translational filter 312 near LO frequency. Components included in the impedance block of each filter branch of the second translational filter 314 are similar, and the second translational filter 314 also has a band-pass frequency response. The difference between the first translational filter 312 and the second translational filter 314 is on the impedances respectively provided by the impedance blocks in the first translational filter 312 and the impedance blocks in the second translational filter 314. Each impedance block in the first translational filter 312 has a resistor having a larger resistance than the corresponding one in the second translational filter 314. In addition, capacitors in all impedance blocks in the translational filter s 312 and 314 are identical. This leads to different in-band gains but the same out-band gains between the first translational filter 312 and the second translational filter 314. FIG. 7 shows the frequency responses of the first translational filter 312, the second translational filter 314, and output of the subtractor 330. It can be seen from FIG. 7 that a frequency response $H_{312}$ of the first translational filter 312 has a larger in-band gain, and a frequency response $H_{314}$ of the second translational filter 314 has a relatively smaller in-band gain, while their out-band gains are the same. As a signal subtractor 330 subtracts the output of the second path 320 from the output of the first path 310, an equivalent frequency response $H_{330}$ could therefore have an out-of-band rejection that is higher than those from both the first translation filter 312 and the second translation filter 314 due to the aforementioned difference in the frequency responses $H_{312}$ and $H_{314}$.

A modification of the embodiment A can be made such that each impedance block of the first translational filter 312 still contains a capacitor and a resistor connected in parallel, while each impedance block of the second translational filter 314 could consist of a parallel connection of a capacitor and an inductor. Hence, a frequency response $H_{314}'$ of the second translational filter 314 in this modification will be of band-stop. As a result, such modification could improve in-band gain reduction due to subtraction.

High out-of-band rejection of the feedforward filter 300 can almost cancels out any undesired out-of-band interference or blockers. In addition, as circuitry of each translational filter does not need to be changed in the feedforward filter, all advantages of translational filter, such as High-Q, and precisely controllable center frequency can be preserved in the feedforward filter 300.

Figure 8:
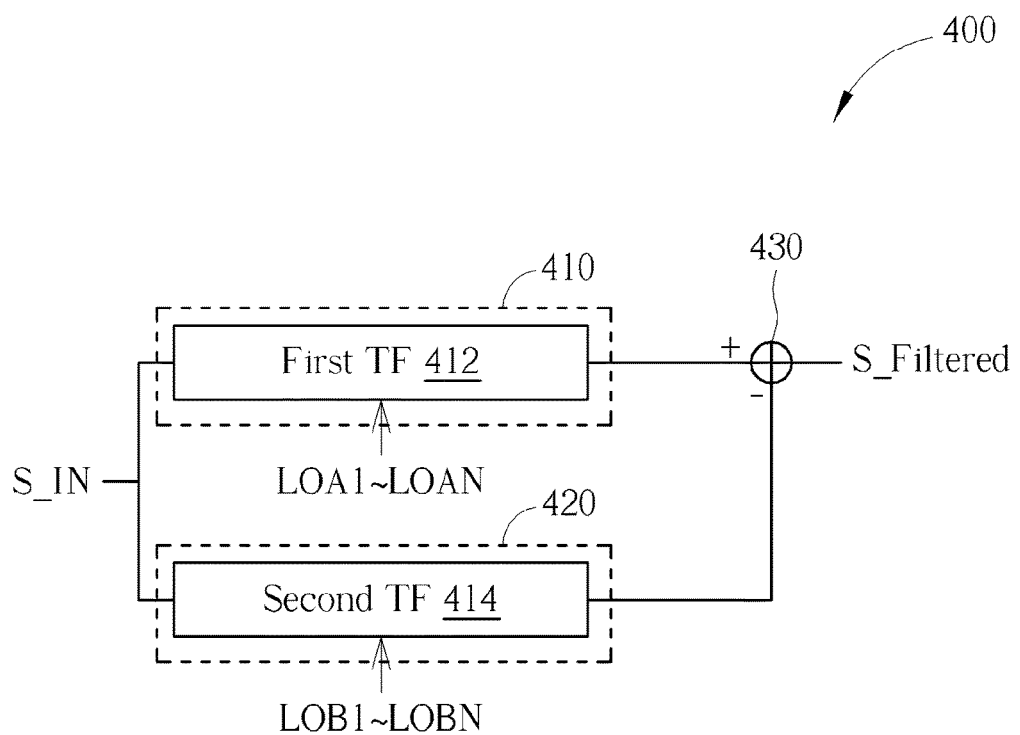
FIG. 8 illustrates a block diagram of a feedforward filter according to an embodiment B of the present invention.

Embodiment B:

FIG. 8 illustrates the embodiment B of the present invention. In this embodiment, a first path 410 and a second path 420 included in the feedforward filter 400 respectively driven by local oscillation signals having different frequencies. The first path 410 includes a first translational filter 412 that has multiple filter branches, and the number of the filter branches in the first translational filter 412 depends on content of the signal S_IN. The filter branches of the first translational filter 412 are respectively driven by local oscillation signals LOA1-LOAN, having same frequency at $f_A$ and different phases. The number of the filter branches in the second translational filter 414 is identical to that of the first translational filter 412, but the filter branches in the second translational filter 414 are driven by local oscillation signals LOB1-LOBN, having same frequency at $f_B$ and different phases. In addition, impedance blocks of the filter branches in the first translational filter 412 are identical to those in the second translational filter 414, all of which have parallel capacitors and resistors in this case.

Figure 9:
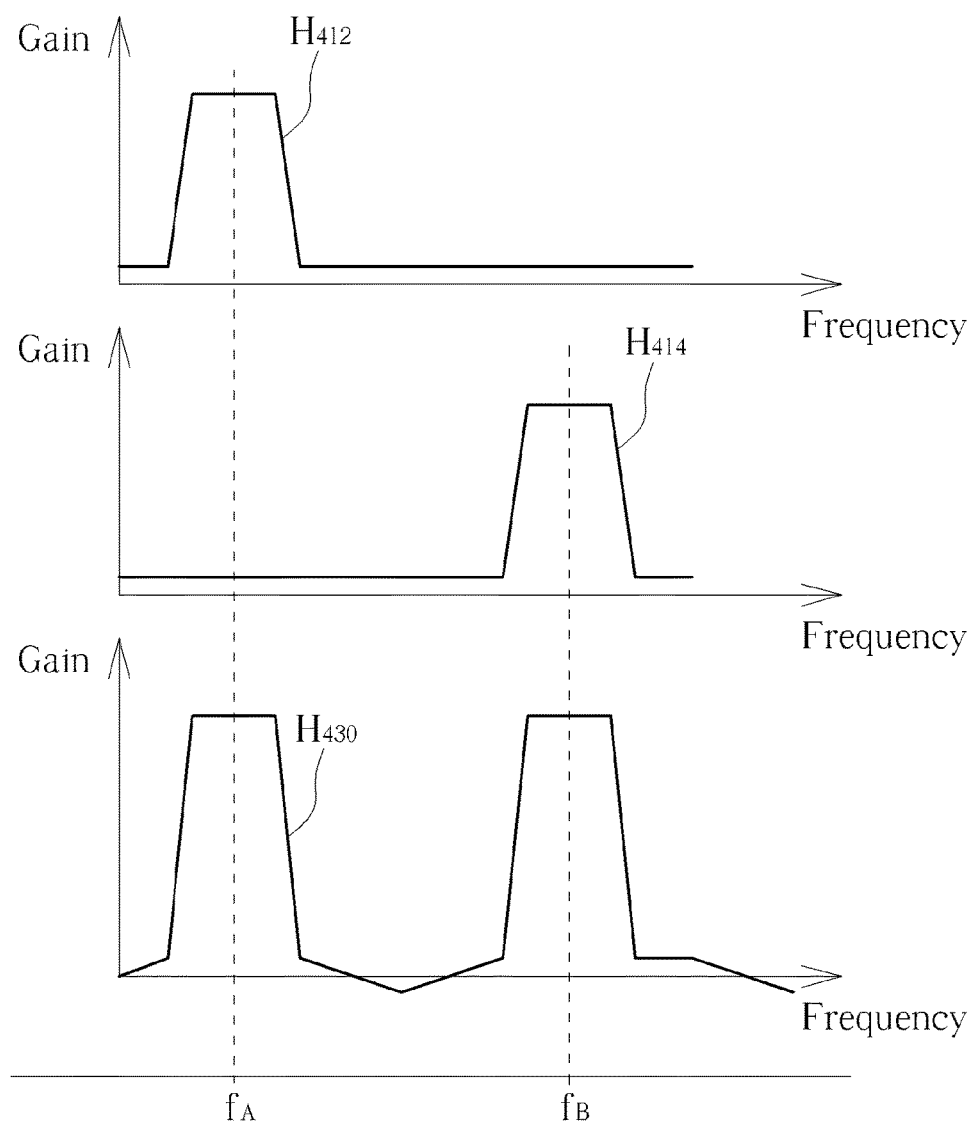
FIG. 9 illustrates frequency responses of first and second translational filter s and an equivalent frequency response with respect to a combination of two paths of the feedforward filter shown in FIG. 8.

Because the filter branches in the first translational filter 412 and the second translational filter 414 are respectively driven by local oscillation signals having different frequencies, a frequency response $H_{412}$ of the first translational filter 412 and a frequency response $H_{414}$ of the second translational filter 414 have different center frequencies. Please refer to FIG. 9, the frequency response $H_{412}$ of the first translational filter 412 has the center frequency at $f_A$ (same to the frequency of LOA1-LOAN), while the frequency response $H_{414}$ of the second translational filter 414 has the center frequency at $f_B$ (same to the frequency of LOB1-LOBN). With a signal subtractor 430 at outputs of the first path 410 and the second path 420, an equivalent frequency response $H_{430}$ with respect to the first path 410 and the second path 420 could have two pass-bands with different center frequencies. Such filter has a novel frequency selection capability, which can allow two ranges of frequencies to be passed, while reject other ranges of frequencies. Due to cancellation by the signal subtractor 430, the out-of-band rejection is also improved. If more paths driven by oscillation signals at different frequencies are added to the feedforward filter, more pass-bands can be created in the frequency response.

Figure 10:
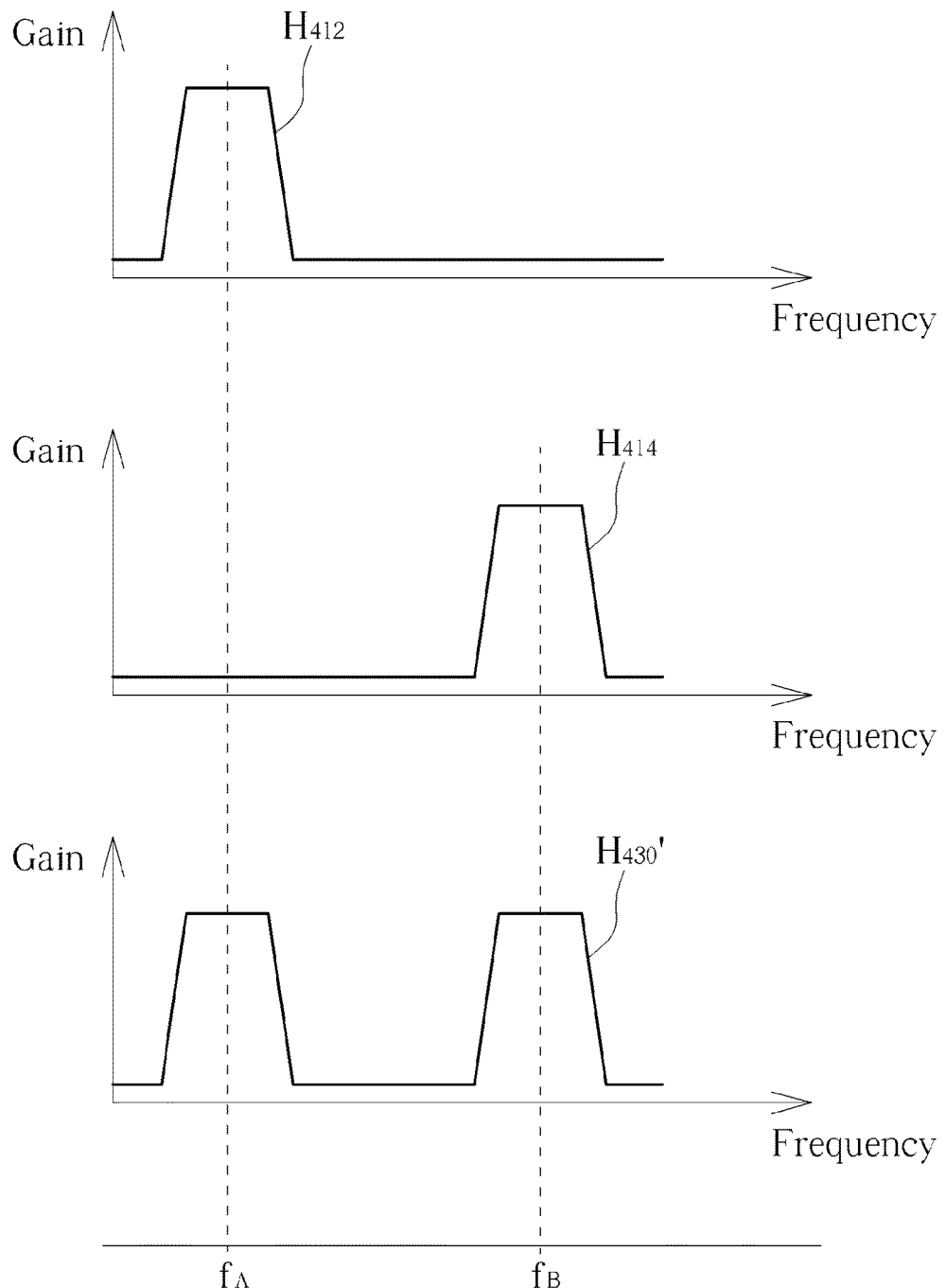
FIG. 10 illustrates frequency responses of first and second translational filter s and an equivalent frequency response with respect to a combination of two paths according to an embodiment C of the present invention.

Embodiment C:

FIG. 10 illustrates frequency responses of a feedforward filter in the embodiment C of the present invention. This embodiment is similar to the embodiment B of FIG. 8. What differs from the embodiment B is that the outputs of the first path and the second path are combined using a signal adder instead of a signal subtractor. As a result, a different equivalent frequency response $H_{430}'$ could be obtained, which has multiple pass-bands. If more paths driven by oscillation signals at different frequencies are added to the feedforward filter, more pass-bands can be created in the frequency response.

The feedforward filter in the embodiment B and C can be used in a multi-channel communication system, thereby receiving multiple desired channels at different frequencies, and rejecting all the other undesired channels, harmonics, interference, and blockers. For example, in a TV system, if programs on multiple channels are desired to be displayed, such filter can be used in a tuner of the TV system, to simultaneously receive programs from these desired channels that conventional tracking filters can hardly achieve.

Figure 11:
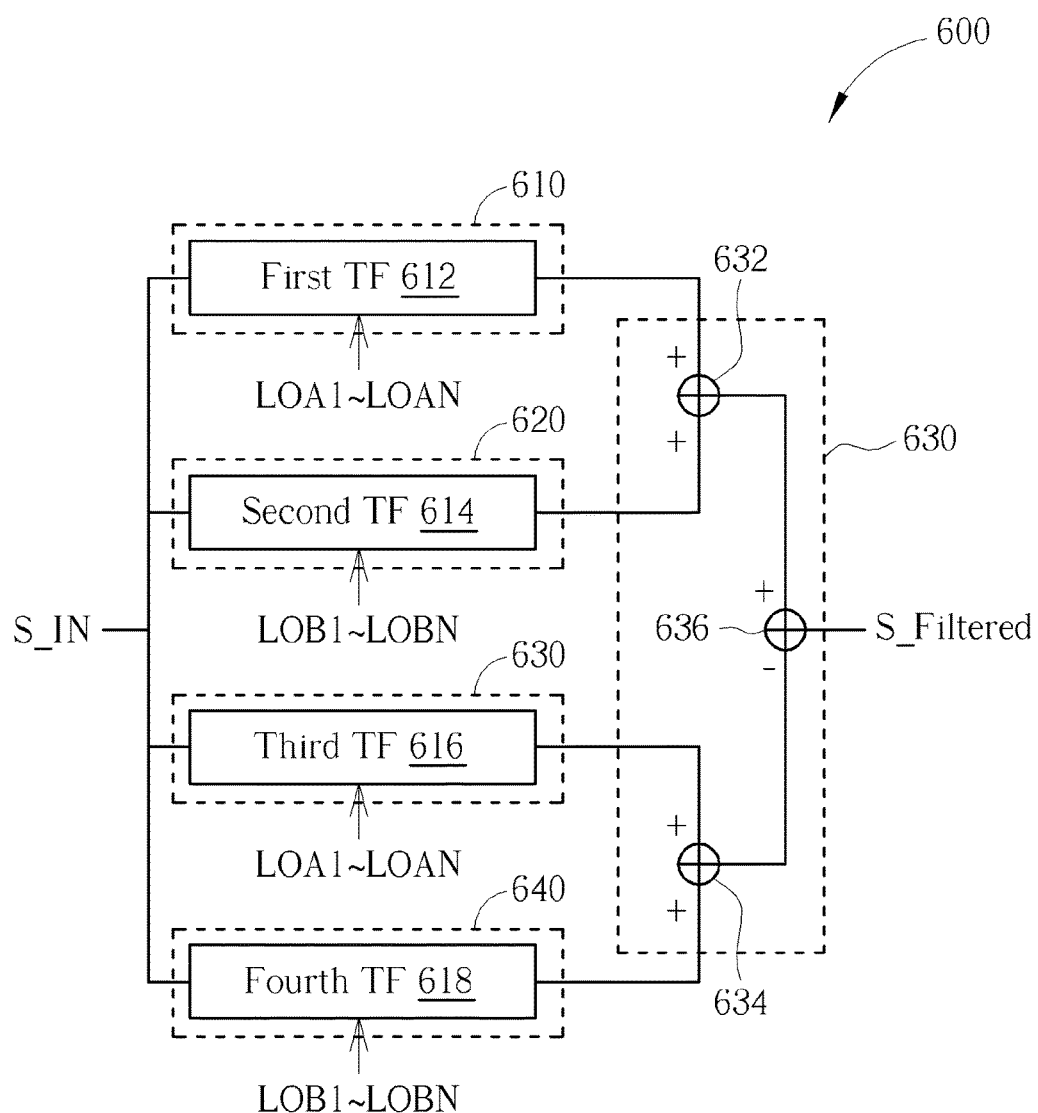
FIG. 11 illustrates a block diagram of a feedforward filter according to an embodiment D of the present invention.
Figure 12:
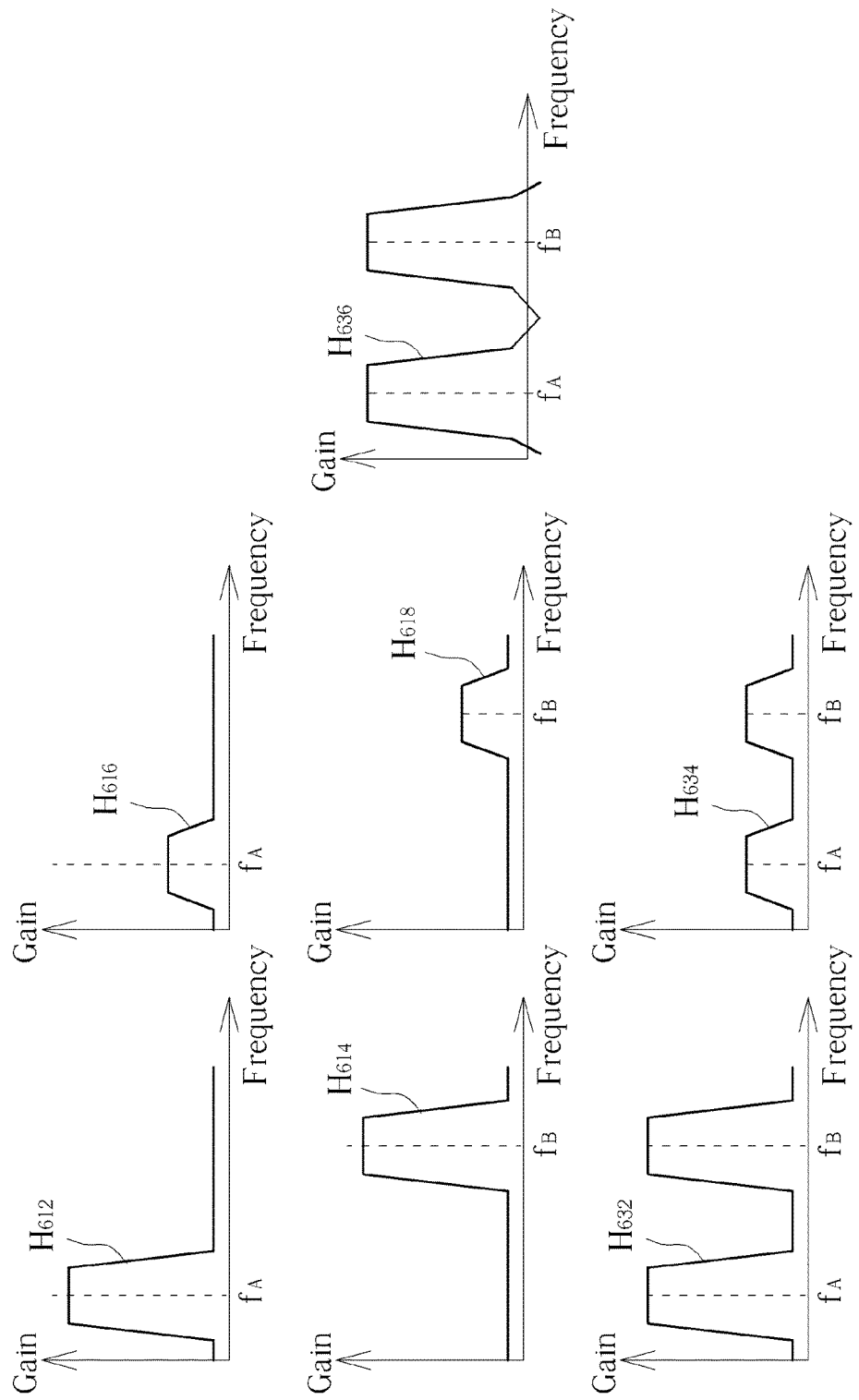
FIG. 12 illustrates frequency responses of translational filter and an equivalent frequency response with respect to a combination of multiple paths of the feedforward filter shown in FIG. 11.

Embodiment D:

FIG. 11 illustrates a feedforward filter with multiple pairs of main and second paths according to the embodiment D of the present invention. As illustrated, a feedforward filter 600 includes four paths 610-640 that respectively have first translational filter 612, second translational filter 614, third translational filter 616 and fourth translational filter 618. All of them have impedance blocks with parallel capacitors and resistors. Hence, all frequency responses $H_{612}$-$H_{618}$ of translational filters 612-618 have band-pass shapes as illustrated in FIG. 12. However, resistance values in the impedance blocks, translational filter s 616 and 618, are relatively smaller than those in translational filters 612 and 614, the frequency responses $H_{616}$ and $H_{618}$ of translational filter s 616 and 618 have relatively smaller in-band gains than those from translational filters 612 and 614. In addition, the filter branches in translational filters 612 and 616 are respectively driven by local oscillation signals LOA1-LOAN having same frequency at $f_A$, while the filter branches of translational filter s 614 and 618 are respectively driven by local oscillation signals LOB1-LOBN having same frequency at $f_B$. Thus, the frequency responses $H_{612}$ and $H_{616}$ have the center frequency at $f_A$, while the frequency responses $H_{614}$ and $H_{618}$ have the center frequency at $f_B$.

The feedforward filter 600 includes a signal combiner 630, which further includes signal adders 632 and 634, and signal subtractor 636. As a result, an equivalent frequency response $H_{632}$ with respect to the first path 610 and the second path 620 will have two pass-bands each having a larger in-band gains, while an equivalent frequency response $H_{634}$ with respect to the third path 630 and the fourth path 640 will also have two pass-bands but each has a relatively smaller in-band gains. In addition, pass-bands in the frequency responses $H_{632}$ and $H_{634}$ respectively have the center frequencies at $f_A$ and $f_B$. With the aid of signal subtractor 636, a frequency response $H_{636}$ which has multiple pass-bands and high out-of-band rejection can be realized. The combiner functions of 632, 634 and 636 can be exchanged for different frequency responses.

Figure 13:
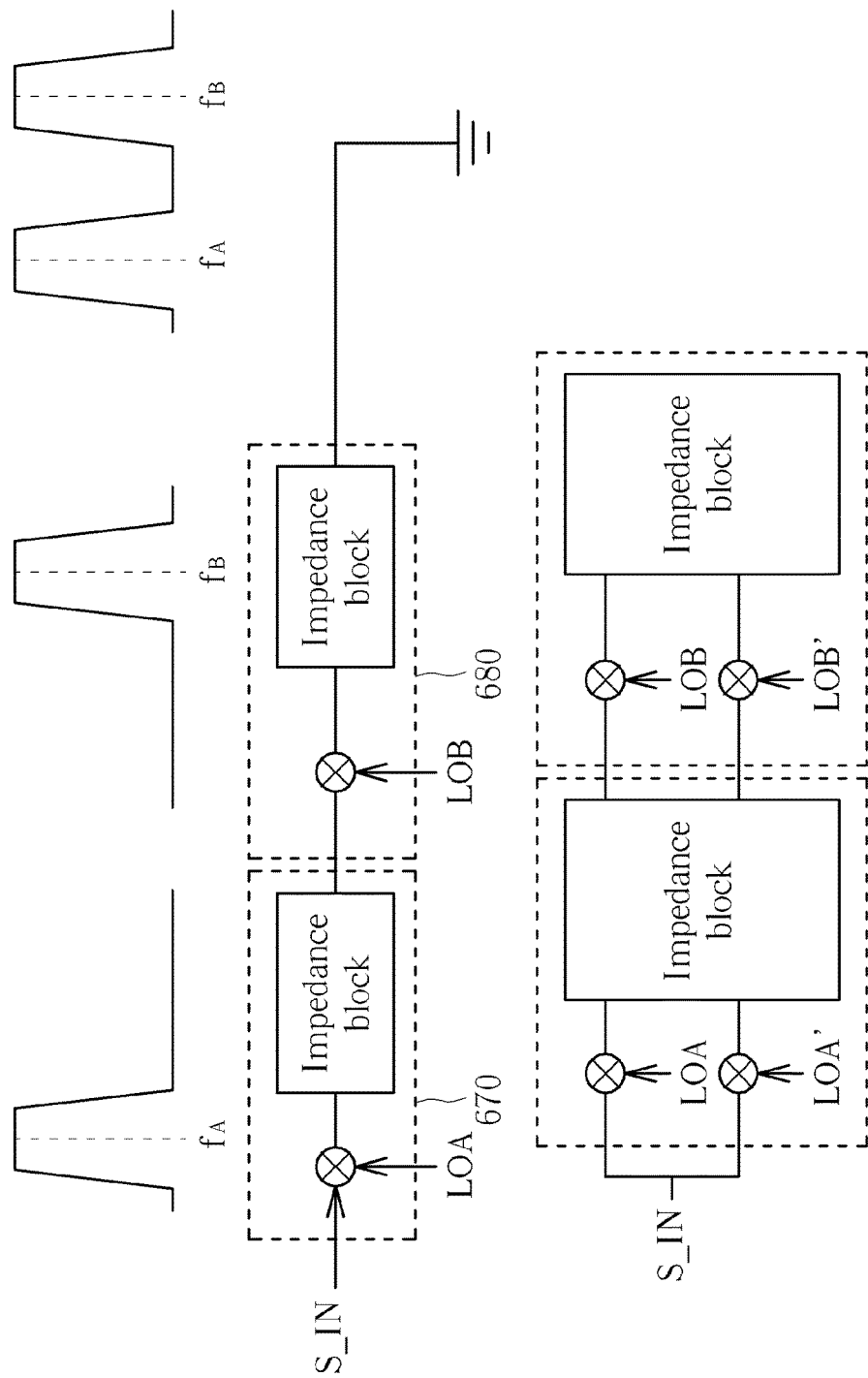
FIG. 13 illustrates another approach to realize a frequency response having multiple pass-bands.

FIG. 13 illustrates another approach to realize the frequency responses $H_{632}$ or $H_{634}$. As shown in FIG. 13, two translational filters 670 and 680 are connected in series. The translational filters 670 and the translational filters 680 respectively comprise a mixer and an impedance block. The mixer of the translational filters 670 mixes the input signal S_IN with a local oscillation signal LOA having the frequency at $f_A$. The impedance block is of capacitor-parallel-resistor type. In view of the above-mentioned embodiment (FIG. 1), the translational filters 670 actually includes two filter branches, each having MOS switches respectively driven by the local oscillation signal LOA and an inverted version of the local oscillation signal LOA' as shown on the bottom side of FIG. 13. A frequency response of the translational filter 670 has a band-pass shape and has the center frequency at $f_A$. Similarly, a frequency response of the translational filters 680 also has a band-pass shape but has the center frequency at $f_B$. The equivalent frequency response of the translational filters 670 and 680 connected in series will result in two pass-bands that respectively have the center frequencies at $f_A$ and $f_B$. Hence, the combination of the first path 610 and the second path 620, or the combination of the third path 630 and the fourth path 640, as shown in FIG. 10, could be replaced with the translational filters 670 and 680 connected in series to achieve the same multiple pass-band frequency response. Furthermore, as mentioned in the conventional translational filter, for the branches having differential relations, the reference ground of the impedance blocks can be merged to form one differential impedance block as well.

Figure 14:
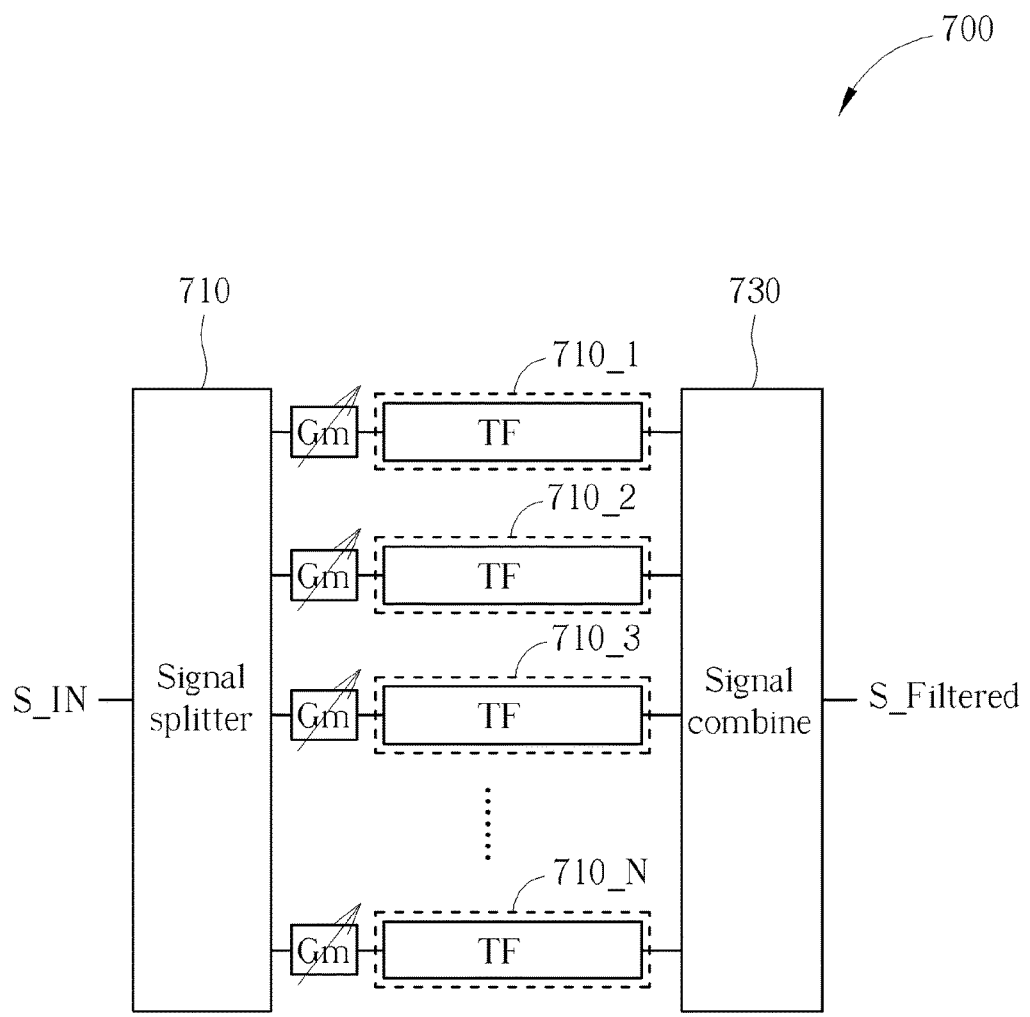
FIG. 14 illustrates a block diagram of a feedforward filter according to an embodiment E of the present invention.

Embodiment E:

FIG. 14 illustrates a generalized feedforward filter 700 which includes multiple paths (more than 2) 710_1~710_N. Each path receives an output of a signal splitter 710 that is generated according to an input signal S_IN and can have different weighting (with adjustable passive or active gain units with respect to the paths). Each path includes a translational filter that has specific filter branches and corresponding local oscillation frequency and phase. Each impedance block of the filter branches in the different translational filters may be different from or identical to each other, or just some of them are identical, depending on target frequency response, while the filter branches in these translational filters may be driven by the same or different local oscillation signals, or just some of them are driven by the same oscillation signals, depending on desired or unwanted channels. A signal combiner 730 combines outputs of all or selected paths to generate a filtered signal S_Filtered by using one signal adder/subtractor or a combination of multiple signal adders and/or signal subtractors, each can also have different weighting. Consequently, frequency responses of each path will be summed or cancelled over different frequency ranges. With proper arrangements of impedance blocks, local oscillation signals, and signal splitter/combiner, the feedforward filter 700 could have a variety of frequency responses. For example, some paths can be arranged to have band-pass responses, while some other paths can be arranged to have band-stop responses. In conjunction with different local oscillation frequencies and phase, a feedforward filter with a reconfigurable and complex filter shapes can be realized. Multiple feedforward filter 700 can further be cascaded to form filters with high flexibilities.

Please note that although only the translational filter is mentioned and included in each path according the above descriptions, the path may further include other components. For example, one or more paths may have adjustable gain units for cancelling a gain mismatch between different paths.

In conclusion, the feedforward filter of the present invention does not need extra high-Q passive components (e.g. external capacitors or inductors) to achieve high-Q, high linearity, and high out-of-band rejection. In other words, high performance filter can be realized without paying much penalty of chip size and cost. In addition, since the out-ofband cancellation is determined solely by mismatch between each path, the feedforward filter of the present invention can achieve outstanding out-of-band rejection even without any mismatch calibration because there are very few sources of mismatch from the nearly identical paths. As a result, the present invention provides a better filter to address the problem of designing filters in the conventional art.

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment. Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A feedforward filter, comprising:
a first path, having a first translational filter, for providing a first frequency response and generating a first output in response to an input signal based on the first frequency response;
at least one second path, each having a second translational filter and coupled to the first path, for providing a second frequency response that is different from the first frequency response, and generating at least one second output in response to the input signal based on the second frequency response; and
a signal combiner, coupled to the first path and the second path, for combining the first output and the at least one second output to generate a filtered signal;
wherein the first translational filter comprises a plurality of filter branches that are respectively driven by a plurality of first oscillation signals and the second translational filter comprises a plurality of filter branches that are respectively driven by a plurality of second oscillation signals, wherein the plurality of first oscillation signals have a same first frequency and the plurality of second oscillation signals have a same second frequency that is different from the first frequency; and each filter branch of the first translational filter has a first terminal coupled to the first path, and a second terminal coupled to a ground or another filter branch, and each filter branch comprises:
a switching mixer coupled between the first terminal and a first impedance block, driven by one of the first oscillation signals; and
the first impedance block, coupled between the switching mixer and the ground or another switching mixer.

2. The feedforward filter of claim 1, wherein the plurality of first oscillation signals and the plurality of second oscillation signals are identical.

3. The feedforward filter of claim 1, wherein the plurality of first oscillation signals have a same first frequency and the plurality of second oscillation signals have a same second frequency that is different from the first frequency.

4. The feedforward filter of claim 1, wherein a number of the filter branches in the first translational filter are identical to a number of the filter branches in the second translational filter.

5. The feedforward filter of claim 1, wherein the first impedance block comprises at least one capacitor.

6. The feedforward filter of claim 5, wherein the first impedance block further comprises one of a resistor and an inductor.

7. The feedforward filter of claim 5, wherein the first impedance block further comprises a resistor and an inductor.

8. The feedforward cancellation filter of claim 1, wherein the first impedance block includes at least one active component.

9. The feedforward filter of claim 1, each filter branch of the second translational filter has a first terminal coupled to the second path, and a second terminal coupled to a ground or another filter branch, and each filter branch comprises:
a switching mixer coupled between the first terminal of the second translational filter and a second impedance block, driven by one of the second oscillation signals; and
a second impedance block, coupled between the switching mixer and the ground or another switching mixer.

10. The feedforward filter of claim 9, wherein components included in the first impedance block is identical to components included in the second impedance block.

11. The feedforward filter of claim 9, wherein components included in the first impedance block is different from components included in the second impedance block.

12. The feedforward filter of claim 9, wherein the first impedance block includes at least a first capacitor in parallel with a first resistor or a first active component, and the second impedance block includes at least a second capacitor in parallel with a second resistor or a second active component or an inductor.

13. The feedforward filter of claim 12, wherein a capacitance of the first capacitor is identical to that of the second capacitor and a resistance of the first resistor is different from that of the second resistor or the design of the first active component is different from that of the second active component.

14. The feedforward filter of claim 1, wherein the signal combiner comprises at least one signal adder or signal subtractor.

15. The feedforward filter of claim 1, wherein the at least one second path comprises a plurality of second paths, and each second path has a second translational filter and coupled to the first path, for providing a plurality of second frequency responses that are different from each other and the first frequency response, thereby generating a plurality of second outputs in response to the input signal based on the plurality of second frequency responses.

16. The feedforward filter of claim 15, wherein a plurality of second paths have an identical frequency response.

17. The feedforward filter of claim 1, wherein the first path further comprises a third translational filter having a third frequency response that is different from the first frequency response, and the first translational filter and the third translational filter are connected in series.

18. The feedforward filter of claim 17, wherein a third translational filter has the same frequency response as a first frequency response.

19. The feedforward filter of claim 1, wherein the second path further comprises a fourth translational filter having a fourth frequency response that is different from the second frequency response, and the second translational filter and the fourth translational filter are connected in series.

20. The feedforward filter of claim 19, wherein the fourth translational filter has the same frequency response as the second frequency response.

21. The feedforward filter of claim 1, wherein the different path further comprises an adjustable gaining unit for providing independent weighting or cancelling a gain mismatch between each path.

22. The feedforward filter of claim 1, wherein the first frequency response is a band-pass response, a band-stop response, an all-pass response or a combination of multiple filter shapes.

23. The feedforward filter of claim 1, wherein an in-band gain of the first frequency response is higher than an in-band gain of second frequency response.

24. The feedforward filter of claim 1, wherein a center frequency of the first frequency response is different from a center frequency of the second frequency response.

25. A feedforward filter, comprising:
a first path, having a first translational filter, for providing a first frequency response and generating a first output in response to an input signal based on the first frequency response;
at least one second path, each having a second translational filter and coupled to the first path, for providing a second frequency response that is different from the first frequency response, and generating at least one second output in response to the input signal based on the second frequency response; and
a signal combiner, coupled to the first path and the second path, for combining the first output and the at least one second output to generate a filtered signal;
wherein the first path further comprises a third translational filter having a third frequency response that is different from the first frequency response, and the first translational filter and the third translational filter are connected in series.

26. The feedforward filter of claim 25, wherein a third translational filter has the same frequency response as a first frequency response.

27. The feedforward filter of claim 25, wherein the first translational filter comprises a plurality of filter branches that are respectively driven by a plurality of first oscillation signals and the second translational filter comprises a plurality of filter branches that are respectively driven by a plurality of second oscillation signals.

28. The feedforward filter of claim 27, wherein the plurality of first oscillation signals and the plurality of second oscillation signals are identical.

29. The feedforward filter of claim 27, wherein the plurality of first oscillation signals have a same first frequency and the plurality of second oscillation signals have a same second frequency that is different from the first frequency.

30. The feedforward filter of claim 27, wherein a number of the filter branches in the first translational filter are identical to a number of the filter branches in the second translational filter.

31. The feedforward filter of claim 27, each filter branch of the first translational filter has a first terminal coupled to the first path, and a second terminal coupled to a ground or another filter branch, and each filter branch comprises:
a switching mixer coupled between the first terminal and a first impedance block, driven by one of the first oscillation signals; and the first impedance block, coupled between the switching mixer and the ground or another switching mixer.

32. A feedforward filter, comprising:
a first path, having a first translational filter, for providing a first frequency response and generating a first output in response to an input signal based on the first frequency response;
at least one second path, each having a second translational filter and coupled to the first path, for providing a second frequency response that is different from the first frequency response, and generating at least one second output in response to the input signal based on the second frequency response; and
a signal combiner, coupled to the first path and the second path, for combining the first output and the at least one second output to generate a filtered signal;
wherein the second path further comprises a fourth translational filter having a fourth frequency response that is different from the second frequency response, and the second translational filter and the fourth translational filter are connected in series.

33. The feedforward filter of claim 32, wherein the fourth translational filter has the same frequency response as the second frequency response.

34. The feedforward filter of claim 32, wherein the first translational filter comprises a plurality of filter branches that are respectively driven by a plurality of first oscillation signals and the second translational filter comprises a plurality of filter branches that are respectively driven by a plurality of second oscillation signals.

35. The feedforward filter of claim 34, wherein the plurality of first oscillation signals and the plurality of second oscillation signals are identical.

36. The feedforward filter of claim 34, wherein the plurality of first oscillation signals have a same first frequency and the plurality of second oscillation signals have a same second frequency that is different from the first frequency.

37. The feedforward filter of claim 34, wherein a number of the filter branches in the first translational filter are identical to a number of the filter branches in the second translational filter.

38. The feedforward filter of claim 34, each filter branch of the first translational filter has a first terminal coupled to the first path, and a second terminal coupled to a ground or another filter branch, and each filter branch comprises:
a switching mixer coupled between the first terminal and a first impedance block, driven by one of the first oscillation signals; and
the first impedance block, coupled between the switching mixer and the ground or another switching mixer.

39. A feedforward filter, comprising:
a first path, having a first translational filter, for providing a first frequency response and generating a first output in response to an input signal based on the first frequency response;
at least one second path, each having a second translational filter and coupled to the first path, for providing a second frequency response that is different from the first frequency response, and generating at least one second output in response to the input signal based on the second frequency response; and
a signal combiner, coupled to the first path and the second path, for combining the first output and the at least one second output to generate a filtered signal;

wherein the feedforward filter further comprises an adjustable gaining unit for providing independent weighting or cancelling a gain mismatch between each path.

40. The feedforward filter of claim 39, wherein the first translational filter comprises a plurality of filter branches that are respectively driven by a plurality of first oscillation signals and the second translational filter comprises a plurality of filter branches that are respectively driven by a plurality of second oscillation signals.

41. The feedforward filter of claim 40, wherein the plurality of first oscillation signals and the plurality of second oscillation signals are identical.

42. The feedforward filter of claim 40, wherein the plurality of first oscillation signals have a same first frequency and the plurality of second oscillation signals have a same second frequency that is different from the first frequency.

43. The feedforward filter of claim 40, wherein a number of the filter branches in the first translational filter are identical to a number of the filter branches in the second translational filter.

44. The feedforward filter of claim 40, each filter branch of the first translational filter has a first terminal coupled to the first path, and a second terminal coupled to a ground or another filter branch, and each filter branch comprises:
a switching mixer coupled between the first terminal and a first impedance block, driven by one of the first oscillation signals; and
the first impedance block, coupled between the switching mixer and the ground or another switching mixer.

45. A feedforward filter, comprising:
a first path, having a first translational filter, for providing a first frequency response and generating a first output in response to an input signal based on the first frequency response;
at least one second path, each having a second translational filter and coupled to the first path, for providing a second frequency response that is different from the first frequency response, and generating at least one second output in response to the input signal based on the second frequency response; and
a signal combiner, coupled to the first path and the second path, for combining the first output and the at least one second output to generate a filtered signal;
wherein an in-band gain of the first frequency response is higher than an in-band gain of second frequency response,
wherein the first translational filter comprises a plurality of filter branches that are respectively driven by a plurality of first oscillation signals and the second translational filter comprises a plurality of filter branches that are respectively driven by a plurality of second oscillation signals, and the plurality of first oscillation signals have a same first frequency and the plurality of second oscillation signals have a same second frequency that is different from the first frequency.

46. The feedforward filter of claim 45, wherein the first translational filter comprises a plurality of filter branches that are respectively driven by a plurality of first oscillation signals and the second translational filter comprises a plurality of filter branches that are respectively driven by a plurality of second oscillation signals.

47. The feedforward filter of claim 46, wherein the plurality of first oscillation signals and the plurality of second oscillation signals are identical.

48. The feedforward filter of claim 46, wherein the plurality of first oscillation signals have a same first frequency and the plurality of second oscillation signals have a same second frequency that is different from the first frequency.

49. The feedforward filter of claim 46, wherein a number of the filter branches in the first translational filter are identical to a number of the filter branches in the second translational filter.

50. The feedforward filter of claim 46, each filter branch of the first translational filter has a first terminal coupled to the first path, and a second terminal coupled to a ground or another filter branch, and each filter branch comprises:
a switching mixer coupled between the first terminal and a first impedance block, driven by one of the first oscillation signals; and
the first impedance block, coupled between the switching mixer and the ground or another switching mixer.

51. A feedforward filter, comprising:
a first path, having a first translational filter, for providing a first frequency response and generating a first output in response to an input signal based on the first frequency response;
at least one second path, each having a second translational filter and coupled to the first path, for providing a second frequency response that is different from the first frequency response, and generating at least one second output in response to the input signal based on the second frequency response; and
a signal combiner, coupled to the first path and the second path, for combining the first output and the at least one second output to generate a filtered signal;
wherein the first translational filter comprises a plurality of filter branches that are respectively driven by a plurality of first oscillation signals and the second translational filter comprises a plurality of filter branches that are respectively driven by a plurality of second oscillation signals; and the plurality of first oscillation signals have a same first frequency and the plurality of second oscillation signals have a same second frequency that is different from the first frequency.

* * * * *